US010163521B2

(12) United States Patent
Meacham

(10) Patent No.: US 10,163,521 B2
(45) Date of Patent: Dec. 25, 2018

(54) HIGH VOLTAGE BOOTSTRAP SAMPLING CIRCUIT

(71) Applicant: Microchip Technology Incorporated, Chandler, AZ (US)

(72) Inventor: Dan Meacham, Del Mar, CA (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/729,294

(22) Filed: Oct. 10, 2017

(65) Prior Publication Data

US 2018/0102180 A1  Apr. 12, 2018

Related U.S. Application Data

(60) Provisional application No. 62/406,881, filed on Oct. 11, 2016.

(51) Int. Cl.
*H01H 51/34* (2006.01)
*G11C 27/02* (2006.01)
*H03K 17/16* (2006.01)
*H03K 17/06* (2006.01)
(Continued)

(52) U.S. Cl.
CPC ......... *G11C 27/026* (2013.01); *H03K 17/063* (2013.01); *H03K 17/168* (2013.01); *H03K 17/6872* (2013.01); *H03K 17/08* (2013.01); *H03K 2217/0054* (2013.01)

(58) Field of Classification Search
USPC ...................................... 307/94, 95
See application file for complete search history.

(56) References Cited

U.S. PATENT DOCUMENTS 5,429,442 A * 7/1995 Schrader .................... B41J 9/38
400/157.3
5,531,774 A * 7/1996 Schulman .......... A61N 1/36185
607/55

(Continued)

FOREIGN PATENT DOCUMENTS

EP        2128633 A1   12/2009   ............. G01R 19/00
EP        2173031 A1    4/2010   ............. H03F 1/26
WO    2011/060287 A1    5/2011   ............. H03K 17/00

OTHER PUBLICATIONS

International Search Report and Written Opinion, Application No. PCT/US2017/056050, 13 pages, dated Jan. 22, 2018.

*Primary Examiner* — Adam Houston
(74) *Attorney, Agent, or Firm* — Slayden Grubert Beard PLLC

(57) ABSTRACT

A bootstrapped sampling switch may be used at lower supply voltages due to its high linearity, wherein the sampled voltage may be substantially higher than the supply voltage. A 2.7 volt or lower DC supply may be used with this sampling switch to sample a much higher voltage. A plurality of these high voltage transmission gate switches may be connected directly together, thereby removing a primary source of channel-to-channel mismatch (the active buffer/voltage reduction circuit) and enables new methods of error compensation not previously possible. The sampling switch circuit does not consume DC current from what is being measured. There may be a small switched capacitor voltage charge and there may be some voltage leakage, but no DC current is drawn from the voltage input being measured.

17 Claims, 5 Drawing Sheets

(51) Int. Cl.
*H03K 17/687* (2006.01)
*H03K 17/08* (2006.01)

(56) References Cited

U.S. PATENT DOCUMENTS

| | | | |
|---|---|---|---|
| 5,572,155 A * | 11/1996 | Tamayama | G11C 27/02 327/94 |
| 5,603,726 A * | 2/1997 | Schulman | A61N 1/36185 607/57 |
| 5,839,959 A * | 11/1998 | Pelkey | G06F 3/0383 463/36 |
| 5,938,691 A * | 8/1999 | Schulman | A61N 1/3787 607/55 |
| 6,017,273 A * | 1/2000 | Pelkey | G06F 3/0383 463/36 |
| 6,078,311 A * | 6/2000 | Pelkey | G06F 3/0383 345/161 |
| 6,184,726 B1 * | 2/2001 | Haeberli | G11C 5/145 327/307 |
| 6,326,740 B1 * | 12/2001 | Chang | H02M 7/53803 315/194 |
| 6,667,894 B2 * | 12/2003 | Arnoux | G11C 8/04 327/33 |
| 6,738,275 B1 * | 5/2004 | Beland | H02M 1/088 363/21.02 |
| 7,157,957 B2 | 1/2007 | Kim | 327/390 |
| 7,176,742 B2 | 2/2007 | Aksin et al. | 327/390 |
| 7,816,951 B1 * | 10/2010 | Lee | G11C 27/024 327/94 |
| 8,299,837 B1 * | 10/2012 | Lin | H03F 3/005 327/337 |
| 8,810,301 B1 * | 8/2014 | Evans | G11C 27/024 327/333 |
| 9,084,333 B2 * | 7/2015 | Chandran | H05B 37/0263 |
| 9,906,143 B1 * | 2/2018 | Yu | H02M 3/33507 |
| 10,034,336 B1 * | 7/2018 | Ye | H05B 33/0818 |
| 2007/0052452 A1 * | 3/2007 | Chou | G11C 5/145 327/94 |
| 2009/0009918 A1 * | 1/2009 | Beland | H02M 1/088 361/58 |
| 2010/0164597 A1 | 7/2010 | Steensgaard-Madsen | 327/390 |
| 2011/0002446 A1 * | 1/2011 | Beland | H05G 1/10 378/111 |
| 2012/0153855 A1 * | 6/2012 | Sun | H05B 33/0815 315/200 R |
| 2013/0161494 A1 * | 6/2013 | Sohn | G11C 27/02 250/214 P |
| 2015/0138856 A1 * | 5/2015 | Huynh | H02M 1/4225 363/84 |
| 2015/0188533 A1 * | 7/2015 | Viswanath | H03K 17/063 378/9 |
| 2016/0104543 A1 * | 4/2016 | Powell | G11C 27/026 327/96 |
| 2017/0179817 A1 * | 6/2017 | Gu | H02M 1/14 |
| 2017/0279352 A1 * | 9/2017 | Kosaraju | G01R 19/16571 |
| 2018/0102180 A1 * | 4/2018 | Meacham | G11C 27/026 |

* cited by examiner

HIGH VOLTAGE BOOTSTRAP SAMPLING CIRCUIT

RELATED PATENT APPLICATION

This application claims priority to commonly owned U.S. Provisional Patent Application No. 62/406,881; filed Oct. 11, 2016; which is hereby incorporated by reference herein for all purposes.

TECHNICAL FIELD

The present disclosure relates to sampling circuits, and, in particular, for sampling circuits used in higher voltage circuits.

BACKGROUND

To measure voltage and current, for example, in power supply circuits, a shunt resistor is coupled with a measurement device, e.g., a sense (measurement) resistor and a sense amplifier coupled to the sense resistor. The higher voltage node of the sense resistor may be called "VBUS" and the voltage node on the load side of the sense resistor may be called "VSENSE." The sense amplifier may also include sampling circuits in the analog front-end circuits. Such devices may be combined with a microcontroller having an analog-to-digital converter (ADC). The microcontroller usually operates at a low voltage and, hence, most of its surrounding support circuits are also designed for such a low voltage, for example, 3.3 or 5 VDC. The power supply circuit, however, often generates a much higher voltage and measuring the current on the high side introduces a high common mode voltage. Using such a measurement circuit to determine the current in a high voltage circuit may, therefore, require a special sampling circuit. Sampling of a high voltage signal with a multiplexer-capable sampling architecture is often desired while not consuming significant power from the input source and not requiring a high-voltage supply. A high voltage in such a scenario may be a voltage of up to about 40 VDC, but up to about 70 VDC is anticipated in the near future.

SUMMARY

Hence, there is a need for an improved sampling circuit.

According to an embodiment, a method for controlling a high-voltage switching circuit with low-voltage control signals may comprise the steps of: providing a low-voltage inverter coupled to at least one low voltage control signal; providing a first high-voltage transistor coupled to and controlled by the low-voltage inverter; providing a second high-voltage transistor coupled to and controlled by the first high-voltage transistor; and providing a primary input/output signal path that may comprise back-to-back third and fourth high-voltage transistors coupled to and controlled by the second high-voltage transistor; wherein the low-voltage inverter turns on the first high-voltage transistor, the first high-voltage transistor turns on the second high-voltage transistor, and the second high-voltage transistor enables the primary input/output signal path by turning on the third and fourth high-voltage transistors.

According to a further embodiment of the method, may comprise the step of boosting a source of the second high-voltage transistor with a floating capacitor using only low voltage control signals. According to a further embodiment of the method, may comprise the step of providing a secondary path to remove leakage and switching currents from the primary input/output signal path. According to a further embodiment of the method, may comprise the step of providing control current required to drive the high-voltage transistors from the secondary path. According to a further embodiment of the method, may comprise the step of providing leakage current for the high-voltage transistors from the secondary path. According to a further embodiment of the method, may comprise the step of driving the floating capacitor from either the primary or secondary path. According to a further embodiment of the method, the high-voltage switching circuit may be used as a transmission-gate switch for high voltage signals without requiring a high voltage supply or high voltage control signals, and without consuming significant current from a high voltage input signal.

According to another embodiment, a high voltage switching circuit for switching a signal at a high common mode voltage, said switching circuit may comprise high voltage input and output transistors controlled by low voltage control signals. According to a further embodiment, the high voltage switching circuit may be adapted as a transmission-gate switch for coupling to a high voltage signal without requiring a high voltage supply, high voltage control signals, and does not draw current from the high voltage signal.

According to yet another embodiment, a high voltage switching circuit for switching a signal at a high common mode voltage may comprise high voltage input and output transistors controlled by low voltage control signals; and a primary current path wherein all current flows through the primary current path. According to a further embodiment, a second input current path may be used to source current necessary to drive the primary current path high voltage input and output transistors. According to a further embodiment, the second input current path may source substantially all leakage current that would have been sourced by the primary current path. According to a further embodiment, a floating capacitor may be driven by either the primary or second input current path.

According to still another embodiment, a sampling circuit and multiplexer may comprise: first and second sample switches having a common connection, in addition the first sample switch may be coupled to a VBUS node, and the second sample switch may be coupled to a VSENSE node; a first sample capacitor having one node thereof coupled to the common connection; a second sample capacitor having one node coupled to another node of the first sample capacitor; a shorting switch coupled in parallel with the second sample capacitor; and an operational amplifier having an input coupled to the junction between the first and second sample capacitors and an output coupled to another node of the second sample capacitor; wherein the first and second sampler switches may comprise high voltage input and output transistors controlled by low voltage control signals.

According to another embodiment, a sampling circuit and multiplexer, may comprise: a plurality of high voltage switching circuits may comprise high voltage inputs and high voltage outputs, and low voltage control inputs; a sample and hold capacitor having a first node coupled to some of the high voltage outputs and a second node coupled to some other of the high voltage outputs; and a two-pole switch having one pole coupled to the first node and another pole coupled to the second node.

According to a further embodiment, an analog-to-digital converter (ADC) may have a differential input coupled to the two-pole switch. According to a further embodiment, may comprise: a sense resistor adapted for coupling between a power supply and a load; some of the high voltage inputs of the plurality of high voltage switching circuits may be coupled to the power supply side of the sense resistor; and some other of the high voltage inputs of the plurality of high voltage switching circuits may be coupled to the load side of the sense resistor.

BRIEF DESCRIPTION OF THE DRAWINGS

A more complete understanding of the present disclosure may be acquired by referring to the following description taken in conjunction with the accompanying drawings wherein.

Figure 1:
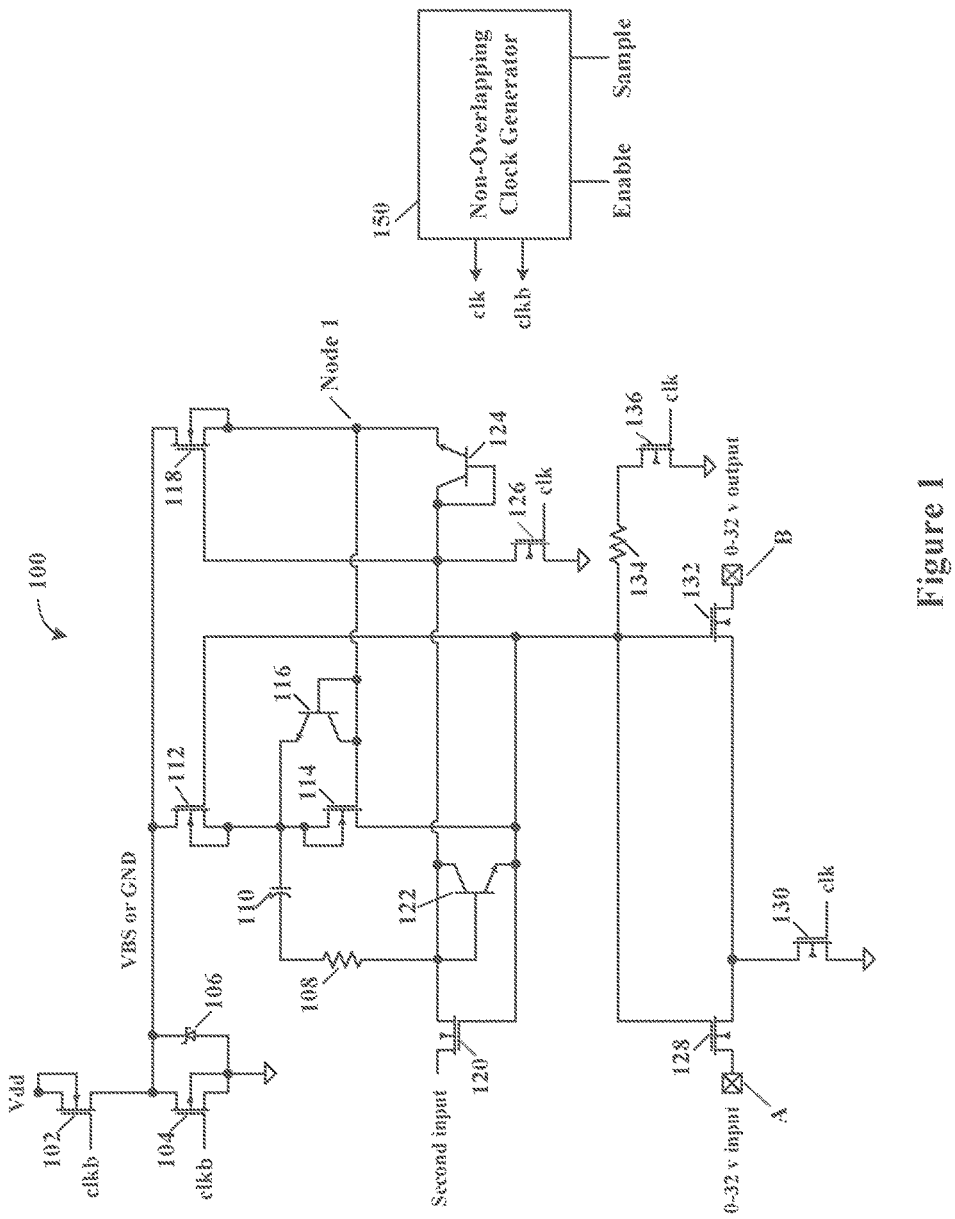
FIG. 1 illustrates a schematic diagram of a high voltage bootstrap sampling circuit, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the forms disclosed herein.

DETAILED DESCRIPTION

According to various embodiments, a classic bootstrapped sampling switch may be used with high linearity analog-to-digital converters (ADCs) that use a sample and hold circuit to force a fixed Vgs (voltage between the gate and source) of a metal oxide semiconductor field effect transistor (MOSFET) sampling switch. Traditionally, a circuit similar to the one disclosed herein (hereinafter "this circuit") may be used at lower voltages due to its high linearity (since the Vgs is constant and not dependent on the input voltage). In this modified circuit, according to various embodiments, many significant changes have been incorporated as follows: (1) The sampled voltage may be substantially higher than the supply voltage. Other prior technology circuits can be found in literature, but the voltage difference must be relatively small. According to the teachings of this disclosure, a 2.7 volt or lower voltage direct current (VDC) supply may be used to sample a 40 VDC or greater, e.g., 70 VDC, common mode (CM) input. (2) Due to the high voltage requirements, special devices must be used which allow the DRAIN voltage to be much higher than the source voltage, but have very explicit restrictions on the GATE-SOURCE voltage at all times. The sampling circuit, according to the teachings of this disclosure, maintains allowable Vgs (<5 VDC) on all devices while still being able to sample high voltages, e.g., 70 VDC CM input signals. (3) Many such prior technology circuits do not support a multiplexed input. For example, each input is used to drive a separate active circuit which generates a low-voltage signal which may then be multiplexed. This circuit allows the outputs from a plurality of high voltage transmission gate switches to be connected directly together, thereby removing a primary source of channel-to-channel mismatch (the active buffer/voltage reduction circuit) and enables new methods of error compensation not previously possible. And (4) this circuit does not consume DC current from what is being measured; there may be a small switched capacitor charging current and there may be some leakage current, but no DC current is drawn from the voltage input being measured (which is a significant differentiator of this circuit from prior technology).

Referring now to the drawings, the details of example embodiments are schematically illustrated. Like elements in the drawings will be represented by like numbers, and similar elements will be represented by like numbers with a different lower-case letter suffix.

Referring to FIG. 1, depicted is a schematic diagram of a high voltage bootstrap sampling circuit, according to a specific example embodiment of this disclosure. A high voltage bootstrap sampling circuit, generally represented by the numeral 100, may comprise transistors 102, 104, 112, 114, 116, 118, 120, 122, 124, 126, 128, 130, 132 and 136; Zener diode 106, capacitor 110, and resistors 108 and 134. Also included may be a non-overlapping clock generator 150 that may be used to generate low-voltage non-overlapping control signals (clocks), e.g., clock outputs "clk" and "clkb."

Zener diode 106 is not strictly required, but can be included to prevent high-voltage kickback (when the switch transitions to the off-state) from damaging the low-voltage transistors also connected at this node. Capacitor 110 may be from about one (1) picofarad (pf) to about 20 pf and may be used to hold the DC voltage which is applied between the GATE and SOURCE of transistors 120, 128, and 132 (the actual switch transistors). Resistor 108 may be from about 0 ohms (unused) to about 100 k ohms and may be used to slew-limit the off-on transition of the switch. Resistor 134 may be from about 0 ohms (unused) to about 100 k ohms and may be used to slew-limit the on-off transition of the switch. The high voltage multiplexer 100 may accept a 0-32 VDC input at either terminal and provide a 0-32 VDC output, regardless of input voltage. All control voltages may be, for example but are not limited to, 5 VDC, 3.3 VDC or lower. To turn the high voltage bootstrap sampling circuit 100 on, the gate and source of switch transistors 120, 128 and 132 are released from GND by taking clk low which turns off transistor 136. The Bootstrap voltage input (the voltage driven by transistors 104 and 102) switches from VBS (~5 VDC) to GND. This pulls down Node 1 until transistor 114 turns on. Transistor 114 forces VBS, e.g., 5 VDC, across Vgs of NMOS switch transistors 120, 128 and 132, thereby turning on transistors 120, 128 and 132, and making them conductive, whereby the high voltage bootstrap sampling circuit 100 is turned ON.

All transistors in the circuit (high voltage bootstrap sampling circuit 100) are held at less than 5 VDC Vgs at all times (including transient voltages). PNP transistors 122 and 116 (which could also be diodes or diode-connected MOSFETs) are only necessary to suppress transient voltages which may exceed 5 VDC during transitions, and may not be necessary in all embodiments. A second input path, shown coupled to transistor 120, may be provided to reduce leakage error at high temperatures. The second input path would be driven by the same voltage as NODE A, or a voltage which is substantially similar (e.g., Vsense could be driven by Vbus).

The Zener diode 106 is for protection against high-voltage kickback and may not be required in certain applications. The resistors 108 and 134 are for slew-rate limiting and may not be required for certain applications. Bipolar junction transistors (BJT) 116, 122 and 124 may be replaced with metal oxide semiconductor field effect transistor (MOSFET) devices connected in a "diode" configuration. Transistors 102 and 104 may be normal low voltage MOSFETs. Vdd is the voltage that will be forced across the high-voltage gate-source junction to turn on the switch. It may vary depending on the HV MOSFET technology but is typically between about 2 VDC to about 5 VDC. It is significant that when the high voltage bootstrap sampling circuit 100 is OFF, the output voltage node can be driven to a high level by another switch device, e.g., many of these switches can be connected in parallel and the OFF switches aren't damaged by a switched-ON voltage output.

Switching of the high voltage bootstrap sampling circuit 100 is done without having to use high-voltage control signals. An inverter circuit, comprising low-voltage transistors 102 and 104, may be controlled by a low-voltage control signal. When this inverter switches from VBS to GND, the transistor 118 pulls down NODE 1 from VDD towards GND which provides sufficient voltage to turn on transistor 114. Now that transistor 114 is conducting, the primary switch transistors 120, 128 and 132 are enabled and will continue to boost the source node of these transistors via the floating capacitor 110 (which may be connected between their gate and source nodes via transistor 114) without need of any high-voltage control logic. Recall that transistor 114 is in its conductive "on" state at this point.

A sacrificial input path comprising transistor(s) 120 (and optional bipolar transistor 122) may be provided to remove leakage current and switching current from the primary input path (transistors 128 and 132). The primary path through the switch (high voltage bootstrap sampling circuit 100) comprises two back-to-back HVNFET devices, transistors 128 and 132. It is desirable that all current flows through the primary path and is not diverted. A second input path may comprise transistor 120, nominally a replica of the primary path, and also a similar HVNFET, may be used to source the current necessary to drive the switching circuitry parasitic loads including gate capacitance associated with transistors 120, 128 and 132, and parasitic (bottom-plate) capacitance of the capacitor 110 as well as other parasitic loads (interconnections, etc.). This second input path also sources most of the device leakage current which can flow through transistors 118 and 124 that would otherwise need to be sourced from the primary path.

The second input may be driven by a voltage similar in magnitude to that of the primary input coupled to transistor 128. This allows a different path for leakage currents and switching currents versus signal currents, reducing the current requirement from the primary input and shifting it to the secondary (proxy) input. The circuit may also be configured without this feature, in which case it looks like the circuit shown in FIG. 2. Also shown in FIG. 2, the diode connected BJTs have been replaced with high-voltage PMOSFET devices.

As a variant of the overall circuit shown in FIG. 1, the floating capacitor 110 may be alternately driven by either the primary (transistors 128 and 132) or the secondary input path (transistor 120). In the embodiment shown in FIG. 2, parasitic capacitance may be driven by the primary path for linearity and design simplicity. However, driving it via the second path would reduce loading on the primary input.

Thus, the circuit shown in FIG. 1 may be used as a transmission-gate switch for high-voltage signals without requiring (1) a high voltage supply or (2) high voltage control signals, and (3) without consuming significant current from the input signal. It may be noted that diodes and overprotection circuitry may or may not be required in an actual implementation depending upon the manufacturing process.

Figure 2:
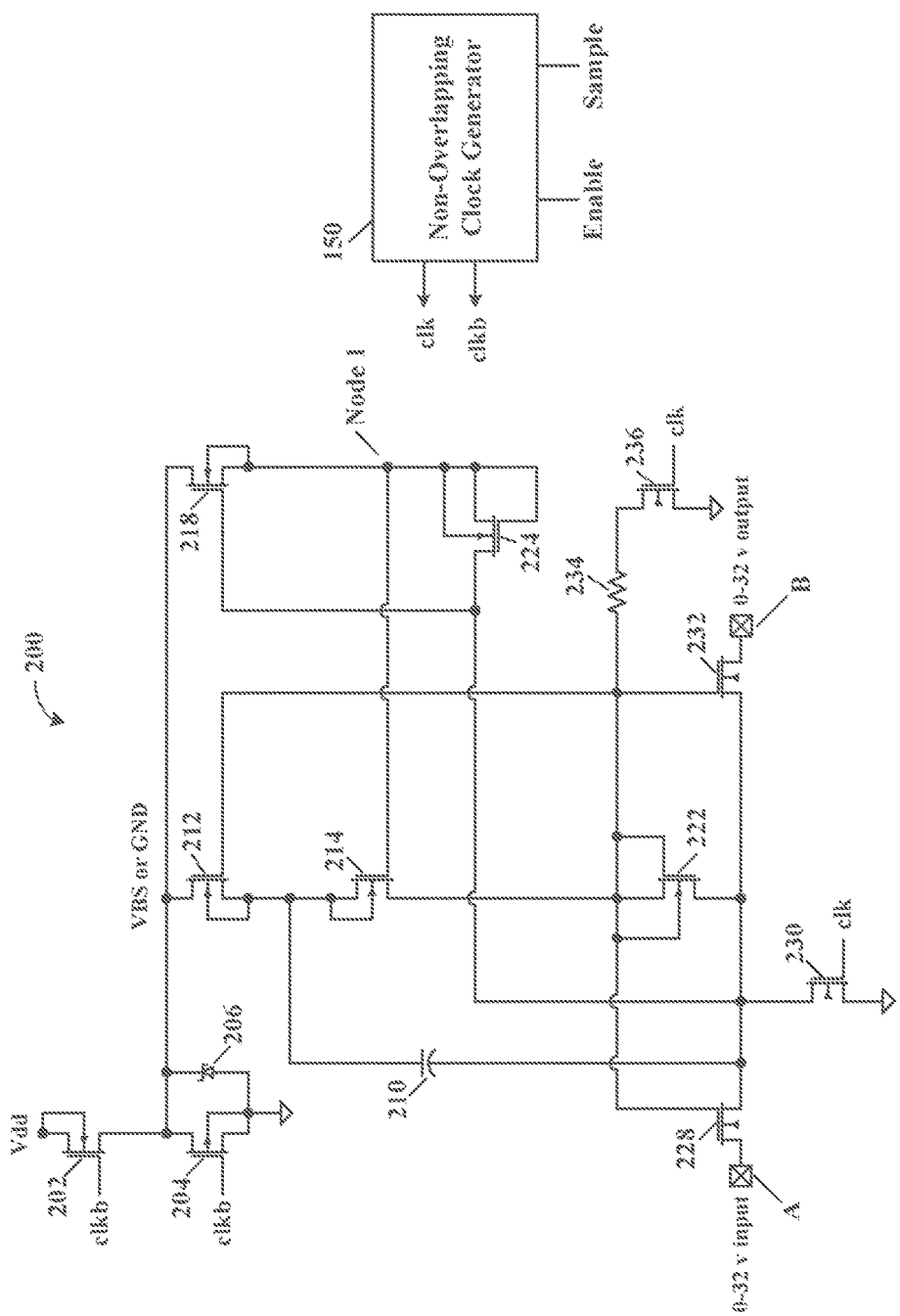
FIG. 2 illustrates a schematic diagram of a high voltage bootstrap sampling circuit, according to another specific example embodiment of this disclosure.

Referring to FIG. 2, depicted is a schematic diagram of a high voltage bootstrap sampling circuit, according to another specific example embodiment of this disclosure. The circuit shown in FIG. 2 operates in substantially the same way as the circuit shown in FIG. 1 and described hereinabove.

The various embodiments disclosed hereinabove, enable key differentiators in the datasheet: Consumes ZERO current from the input because the small switched-capacitor current is in the ~ nanoampere range. (ESD leakage and switched-cap current of following circuit may increase this to approximately ~1 µA). From the input's point of view, this device can be seen as a passive device whereby ideal matching between different input paths is guaranteed by design and a measured ~<1 LSB (16 bit) matching between 4× multiplexed input paths may be provided. This high voltage multiplexer 100, according to various embodiments, allows replica DC-offset calibration & offset dithering whereby a measured <1 LSB (3 µV) input offset voltage is provided through the entire system (32 VDC range). The various embodiments further allow external resistor-capacitor (RC) filtering of inputs without corrupting measurement. Conventional devices warn of external resistors and printed circuit board (PCB) trace resistance corrupting measurements. For example, some conventional devices state: "It is recommended to place the sense resistors as close as possible to the device and not to use minimum width PCB traces". An evaluation board including a front-end device, according to various embodiments, may include 100-Ohm series resistors on each input (not required). This allows a system user to place sense resistors close to generating circuitry where they make the most sense.

Figure 3:
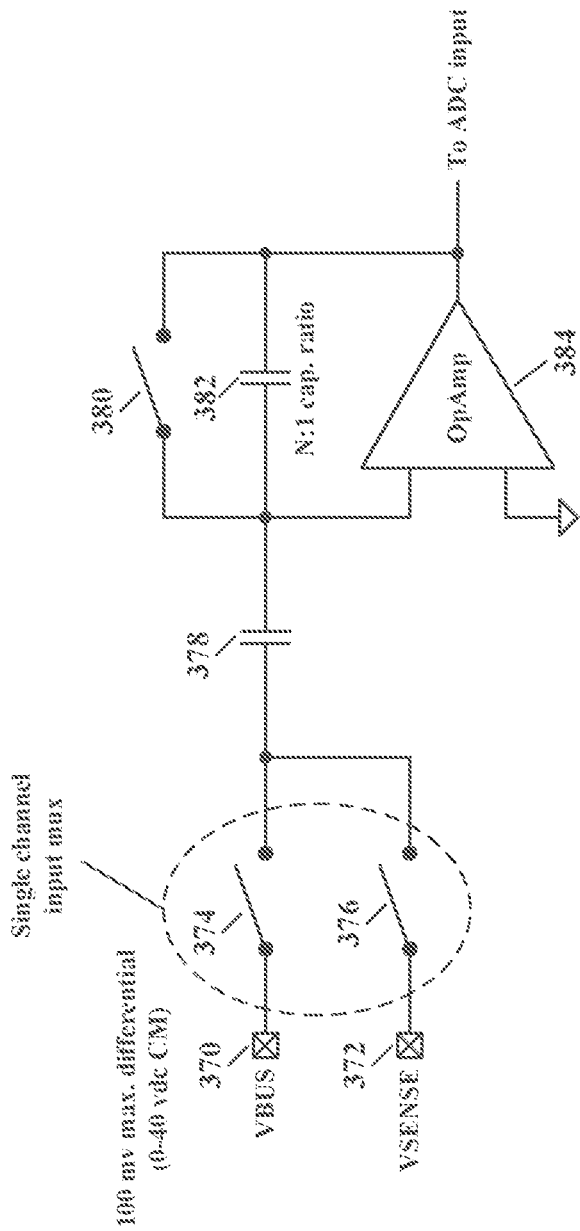
FIG. 3 illustrates a schematic diagram of a sampling circuit with a single channel differential-input multiplexer comprising two high-voltage switches.

Referring to FIG. 3, depicted is a schematic diagram of a sampling circuit with a single channel differential-input multiplexer comprising two high-voltage switches. According to the teachings of this disclosure, a small differential voltage must be measured on top of a large common-mode voltage. The common-mode may be from about zero (0) VDC to about 32 VDC. The differential signal may be, for example, as small as +/−25 mV, for example, a voltage caused by a current through a sense resistor. The supply voltage for this circuit may be, for example but is not limited to, 2.6 VDC. As an example, but not a limitation, eight inputs may be multiplexed, with each one having a different (unknown) common mode voltage $V_{CM}$. The circuit shown in FIG. 3 is an example of a switch-multiplexer that may be used in a higher-level system to measure a small differential voltage (at high VCM) and convert it to a larger low-voltage signal.

Figure 4:
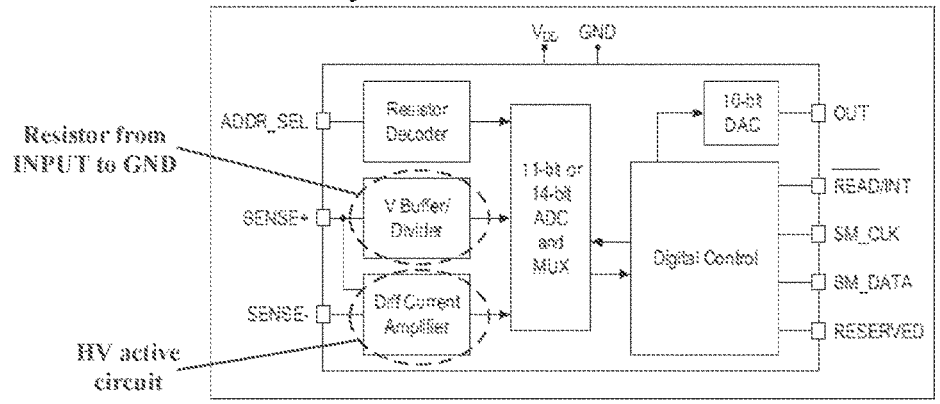
FIG. 4 illustrates schematic block diagrams of prior technology sampling circuits used in similar applications.
Figure 4:
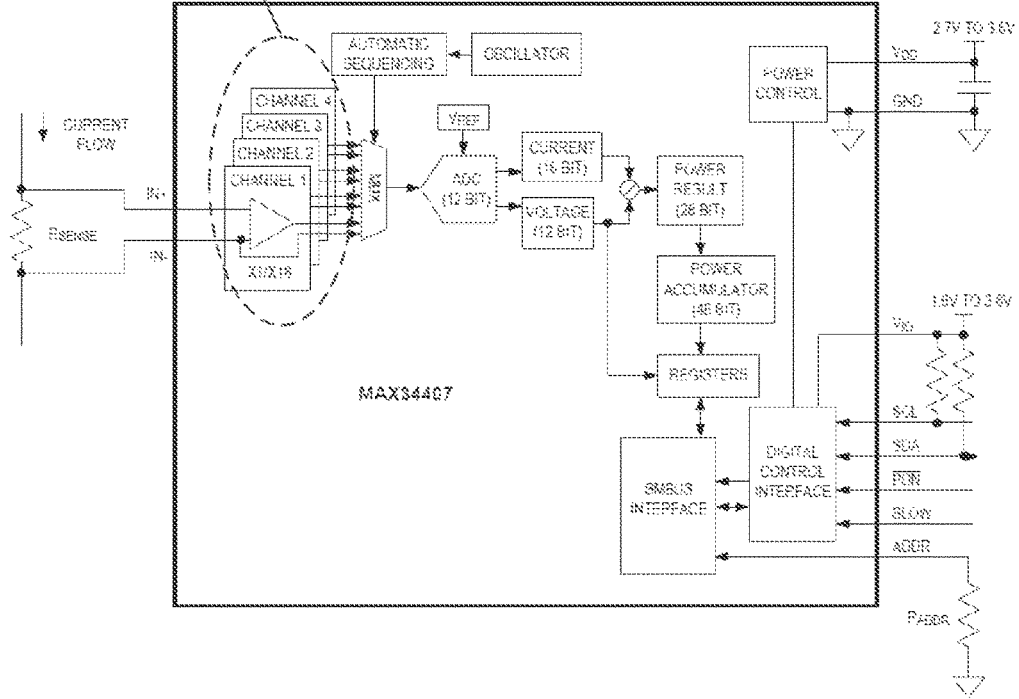

Referring to FIG. 4, depicted are schematic block diagrams of prior technology sampling circuits. The prior technology sampling circuits shown in FIG. 4 have no high-side voltage rail available, so power is taken from the input signal itself. Power taken from the input being measured is a key parameter. For example, the PAC1921 manufactured by the Assignee of the present application, uses no multiplexers and takes about 35 microamperes from each input channel. The PAC1720 (not shown) manufactured by the Assignee of the present application, includes a two-channel multiplexer and takes about 150 microamperes from each input channel. According to various embodiments disclosed herein, a design target may be less than about one microampere with a four-channel multiplexer. A substantial improvement over prior technologies. In this case, the PAC1921 uses a resistor divider to measure the VBUS voltage (0-32 v) by dividing it to a voltage between 0-3 v. The PAC1921 uses a differential amplifier operating on the VBUS power supply to buffer the small differential voltage between VBUS and VSENSE and drive the resulting signal into a low-voltage ADC. The MAX34407, from the block diagram shown in FIG. 4, also includes an active high-voltage buffer operating from the external VBUS power supply.

Present technology devices, such as those shown in FIG. 4: a) comprise a differential input buffer amplifier powered from the high-side input (most common). The present technology amplifiers use DC current from the voltage input being measured and don't work down to zero (0) VDC. A source of channel-to-channel mismatch exists in these present technology devices. It is difficult to make bidirectional input since it is unknown which differential input carries the highest voltage; b) in some present technology devices, the switch transistor is powered from high-side input in such present technology devices and they use DC current from the input to create Vgs for the switch. Again, this does not work down to zero VDC and it doesn't lend itself to a multiplexing configuration; c) some present technology devices use an AC-coupled switching control, which causes high variability, doesn't lend itself to a multiplexing configuration either, and is difficult to turn off as well (DC leakage can be high); and d) some present technology devices use a resistor-divider at the input, which uses DC current from the input, limits channel-to-channel matching to about 8 bits, and corrupts the signal-to-noise ratio (SNR).

Figure 5:
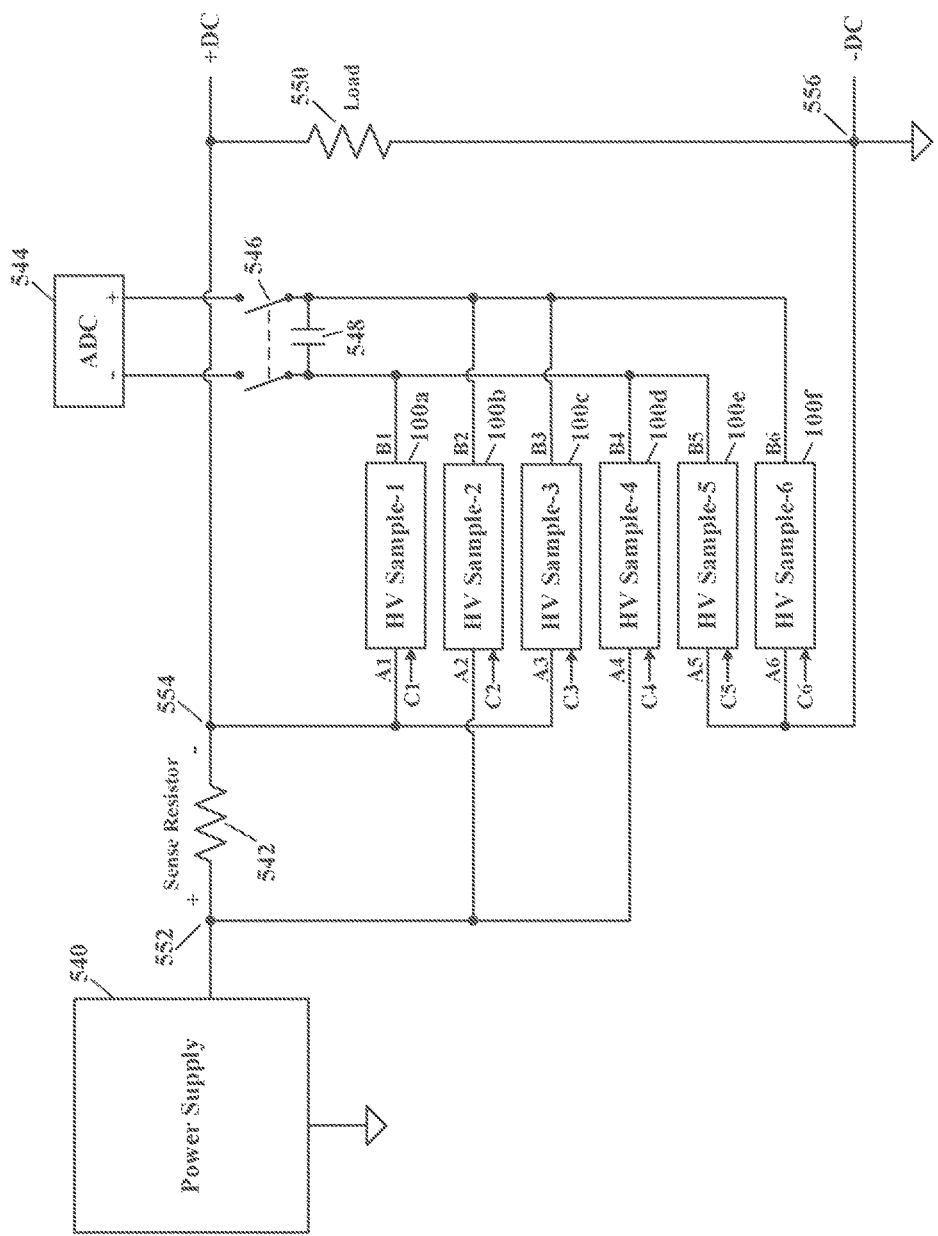
FIG. 5 illustrates a schematic block diagram of a simplified example application of the high voltage bootstrap sampling circuits shown in FIGS. 1 and 2, and adapted to couple current and voltage measurements of a power supply to a sampling circuit analog-to-digital converter (ADC), according the teachings of this disclosure.

Referring to FIG. 5, depicted is a schematic block diagram of a simplified example application of the high voltage bootstrap sampling circuits shown in FIGS. 1 and 2, and adapted to couple current and voltage measurements of a power supply to a sampling circuit analog-to-digital converter (ADC), according the teachings of this disclosure. A plurality of high voltage bootstrap sampling circuits 100/200 may be coupled to a current sense resistor 542 and a power supply output voltage measured across a load (resistor) 550. Selected ones of the plurality of high voltage bootstrap sampling circuits 100/200 may connect different voltage nodes 552, 554 and 556 to a sample and hold capacitor 548. Two of the plurality of high voltage bootstrap sampling circuits 100/200 may be selected to couple plus and minus voltages of the voltage nodes to be measured to the sample and hold capacitor 548. Then these two bootstrap sampling circuits 100/200 are turned off (disconnected from the sample and hold capacitor 548), and the sample switch 546 is closed. Whereby the sampled voltage stored on the sample and hold capacitor 548 is coupled to a differential input (+/−) of an analog-to-digital convertor (ADC) 544 that may then convert the stored sampled voltage to a digital value that may be coupled to a microcontroller (not shown) for processing thereof.

For example:
Node 552 coupled to (+) capacitor 548 when high voltage sample circuit 100*b* is enabled.
Node 554 coupled to (−) capacitor 548 when high voltage sample circuit 100*a* is enabled.
Node 552 coupled to (−) capacitor 548 when high voltage sample circuit 100*d* is enabled.
Node 554 coupled to (+) capacitor 548 when high voltage sample circuit 100*c* is enabled.
Node 556 coupled to (−) capacitor 548 when high voltage sample circuit 100*e* is enabled.
Node 556 coupled to (+) capacitor 548 when high voltage sample circuit 100*f* is enabled.

Thus, the voltage drop across resistor 542 (power supply current supplied to load) may be measured as either a positive voltage (high voltage sample circuits 100*b* and 100*a* enabled) or a negative voltage (high voltage sample circuits 100*d* and 100*c* enabled). The voltage supplied to the load (resistor 550) may be measured as either a positive voltage (high voltage sample circuits 100*c* and 100*e* enabled) or a negative voltage (high voltage sample circuits 100*a* and 100*f* enabled). By alternating between positive and negative voltage measurements and averaging, a more accurate voltage measurement may be obtained.

Bidirectional measurement capability, e.g., plus (+) or minus (−) differential voltage measurements, may also be considered a desirable key parameter. Prior technology measurement circuits do not easily support bidirectional measurement without significant penalties in power consumption or complexity. It is difficult since one doesn't know which rail may carry the higher voltage potential and prior technology may depend on the higher (more positive) voltage potential for operating power.

Another way of implementing a multiplexer, according to the teachings of this disclosure and shown in FIG. 3, is to first sample one voltage (VBUS) at node 370 (via switch 374) and store it onto capacitor 378 while the other capacitor 382 is reset to zero volts via switch 380. Then switch the other voltage (VSENSE) on node 372 (via switch 376) onto the capacitor 378 so the operational amplifier 384 will magnify the difference onto capacitor 382 via an N:1 capacitance ratio, for example an 8:1 capacitance ratio but is not limited to a specific capacitance ratio.

The various embodiments disclosed hereinabove, enable key differentiators in the product performance: Consumes substantially no current from the input voltage, because the small switched-capacitor current is in the ~ nanoampere range. (ESD leakage and switched-cap current of following circuit may increase this to ~1 µA). From the input's point of view, this device can be seen as a passive device whereby ideal matching between different input paths is guaranteed by design and a measured ~1 LSB (16b) matching between 4× multiplexed input paths may be provided. This high voltage multiplexer 100, according to various embodiments, allows replica DC-offset calibration & offset dithering wherein a measured <1 LSB (3 uV) input offset voltage is provided through the entire system (32 VDC range). The various embodiments further allow external resistor-capacitor (RC) filtering of inputs without corrupting measurement. Conventional devices warn of external resistors and printed circuit board (PCB) trace resistance corrupting measurements. For example, some conventional device specifications state: "It is recommended to place the sense resistors as close as possible to the device and not to use minimum width PCB traces." An evaluation board including a front-end device, according to various embodiments, may include 100-Ohm series resistors on each input (not required). This allows a system user to place sense resistors close to generating circuitry where they make the most sense.

Conventional parts consume from about 10 µA to about 100 µA from the high-voltage input. The various embodiments allow nanoampere level bias currents from the inputs.

Bias currents this low allow the "sense resistors" to be located far from the high voltage multiplexer 100 and also allow RC low pass filtering to be used at the input pins. This design also allows for kilo-ohm resistances before significant measurement circuit error is seen.

The invention claimed is:

1. A method for controlling a high-voltage switching circuit with low-voltage control signals, said method comprising the steps of:
providing a low-voltage inverter coupled to at least one low voltage control signal;
providing a first high-voltage transistor coupled to and controlled by the low-voltage inverter;
providing a second high-voltage transistor coupled to and controlled by the first high-voltage transistor; and
providing a primary input/output signal path comprising back-to-back third and fourth high-voltage transistors coupled to and controlled by the second high-voltage transistor; wherein
the low-voltage inverter turns on the first high-voltage transistor,
the first high-voltage transistor turns on the second high-voltage transistor, and
the second high-voltage transistor enables the primary input/output signal path by turning on the third and fourth high-voltage transistors.

2. The method according to claim 1, further comprising the step of boosting a source of the second high-voltage transistor with a floating capacitor using only low voltage control signals.

3. The method according to claim 2, further comprising the step of providing a secondary path to remove leakage and switching currents from the primary input/output signal path.

4. The method according to claim 3, further comprising the step of providing control current required to drive the high-voltage transistors from the secondary path.

5. The method according to claim 3, further comprising the step of providing leakage current for the high-voltage transistors from the secondary path.

6. The method according to claim 3, further comprising the step of driving the floating capacitor from either the primary or secondary path.

7. The method according to claim 1, wherein the high-voltage switching circuit is used as a transmission-gate switch for high voltage signals without requiring a high voltage supply or high voltage control signals, and without consuming significant current from a high voltage input signal.

8. A high voltage switching circuit for switching a signal at a high common mode voltage, said switching circuit comprising high voltage input and output transistors controlled by low voltage control signals.

9. The high voltage switching circuit according to claim 8, is adapted as a transmission-gate switch for coupling to a high voltage signal without requiring a high voltage supply, high voltage control signals, and does not draw current from the high voltage signal.

10. A high voltage switching circuit for switching a signal at a high common mode voltage, said switching circuit comprising high voltage input and output transistors controlled by low voltage control signals; and a primary current path wherein all current flows through the primary current path.

11. The high voltage switching circuit according to claim 10, further comprising a second input current path used to source current necessary to drive the primary current path high voltage input and output transistors.

12. The high voltage switching circuit according to claim 11, wherein the second input current path sources substantially all leakage current that would have been sourced by the primary current path.

13. The high voltage switching circuit according to claim 11, further comprising a floating capacitor driven by either the primary or second input current path.

14. A sampling circuit and multiplexer, comprising:
first and second sample switches having a common connection, in addition
the first sample switch is coupled to a VBUS node, and the second sample switch is coupled to a VSENSE node;
a first sample capacitor having one node thereof coupled to the common connection;
a second sample capacitor having one node coupled to another node of the first sample capacitor;
a shorting switch coupled in parallel with the second sample capacitor; and
an operational amplifier having an input coupled to the junction between the first and second sample capacitors and an output coupled to another node of the second sample capacitor;
wherein the first and second sampler switches comprise high voltage input and output transistors controlled by low voltage control signals.

15. A sampling circuit and multiplexer, comprising:
a plurality of high voltage switching circuits comprising high voltage inputs and high voltage outputs, and low voltage control inputs;
a sample and hold capacitor having a first node coupled to some of the high voltage outputs and a second node coupled to some other of the high voltage outputs; and
a two-pole switch having one pole coupled to the first node and another pole coupled to the second node.

16. The sampling circuit and multiplexer according to claim 15, further comprising an analog-to-digital converter (ADC) having a differential input coupled to the two-pole switch.

17. The sampling circuit and multiplexer according to claim 15, further comprising:
a sense resistor adapted for coupling between a power supply and a load;
some of the high voltage inputs of the plurality of high voltage switching circuits are coupled to the power supply side of the sense resistor; and
some other of the high voltage inputs of the plurality of high voltage switching circuits are coupled to the load side of the sense resistor.

\* \* \* \* \*